(12) United States Patent  
Park et al.

(10) Patent No.: US 7,514,726 B2  
(45) Date of Patent: *Apr. 7, 2009

(54) GRADED INDEX SILICON GERANIUM ON LATTICE MATCHED SILICON GERANIUM SEMICONDUCTOR ALLOY

(75) Inventors: Yeonjoon Park, Yorktown, VA (US); Sang H. Choi, Poquoson, VA (US); Glen C. King, Yorktown, VA (US); James R. Elliott, Jr., Yorktown, VA (US); Diane M. Stoakley, Yorktown, VA (US)

(73) Assignee: The United States of America as represented by the Aministrator of the National Aeronautics and Space Administration, Washington, DC (US)

( * ) Notice: Subject to any disclaimer, the term of this patent is extended or adjusted under 35 U.S.C. 154(b) by 446 days.

This patent is subject to a terminal disclaimer.

(21) Appl. No.: 11/387,086

(22) Filed: Mar. 21, 2006

(65) Prior Publication Data  
US 2007/0222034 A1    Sep. 27, 2007

(51) Int. Cl.  
*H01L 31/00*    (2006.01)  
*H01L 35/26*    (2006.01)  
*H01L 31/117*    (2006.01)

(52) U.S. Cl. .................. 257/190; 257/191; 257/616; 257/627; 257/E89.004; 257/E29.068

(58) Field of Classification Search ................ 257/190, 257/191, 616, 627, E29.004, E29.068  
See application file for complete search history.

(56) References Cited

U.S. PATENT DOCUMENTS

| | | | |
|---|---|---|---|
| 5,951,757 A | 9/1999 | Dubbleday et al. | |
| 7,341,883 B2 * | 3/2008 | Park et al. | 438/46 |
| 7,368,335 B2 * | 5/2008 | Asami et al. | 438/150 |
| 2004/0147079 A1 | 7/2004 | Forbes et al. | |
| 2004/0173790 A1 | 9/2004 | Yeo et al. | |
| 2004/0201022 A1 | 10/2004 | Yamazaki et al. | |
| 2004/0214407 A1 | 10/2004 | Westoff et al. | |
| 2004/0221792 A1 | 11/2004 | Forbes | |
| 2006/0211221 A1 * | 9/2006 | Mantl et al. | 438/475 |
| 2007/0069195 A1 * | 3/2007 | Park et al. | 257/19 |

* cited by examiner

*Primary Examiner*—Ngan Ngo  
(74) *Attorney, Agent, or Firm*—Linda B. Blackburn; Barry V. Gibbens

(57) ABSTRACT

A lattice matched silicon germanium (SiGe) semiconductive alloy is formed when a {111} crystal plane of a cubic diamond structure SiGe is grown on the {0001} C-plane of a single crystalline $Al_2O_3$ substrate such that a <110> orientation of the cubic diamond structure SiGe is aligned with a <1,0,-1,0> orientation of the {0001} C-plane. A lattice match between the substrate and the SiGe is achieved by using a SiGe composition that is 0.7223 atomic percent silicon and 0.2777 atomic percent germanium. A layer of $Si_{1-x}Ge_x$ is formed on the cubic diamond structure SiGe. The value of X (i) defines an atomic percent of germanium satisfying $0.2277 < X < 1.0$, (ii) is approximately 0.2777 where the layer of $Si_{1-x}Ge_x$ interfaces with the cubic diamond structure SiGe, and (iii) increases linearly with the thickness of the layer of $Si_{1-x}Ge_x$.

24 Claims, 3 Drawing Sheets

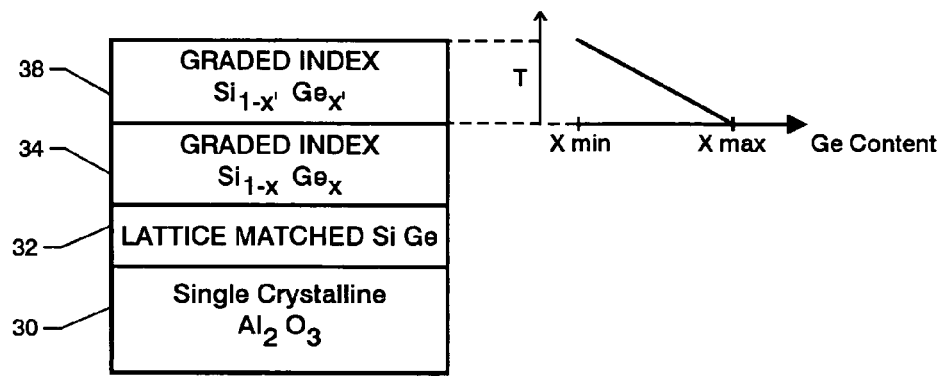
FIG. 4B
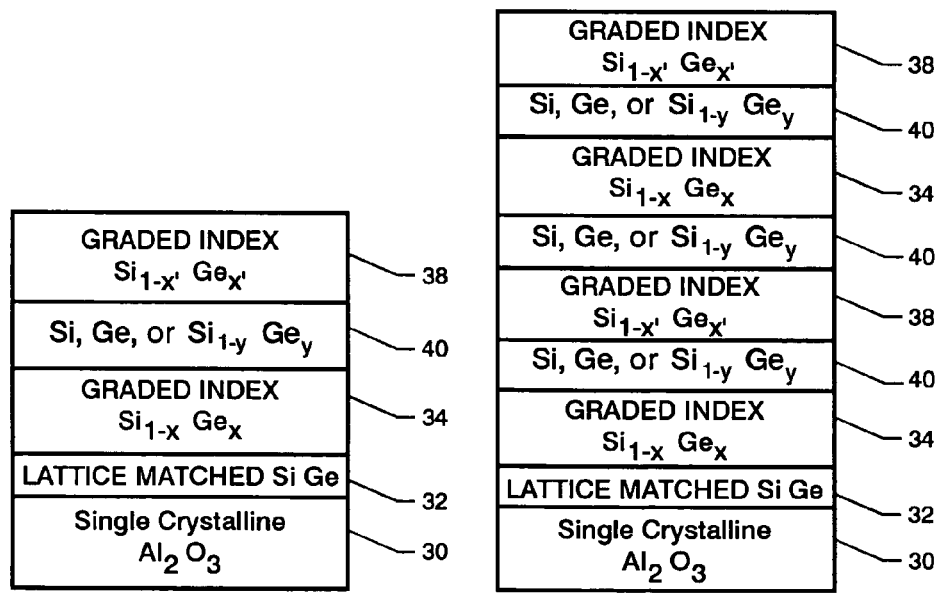
FIG. 4C
FIG. 4D

GRADED INDEX SILICON GERANIUM ON LATTICE MATCHED SILICON GERANIUM SEMICONDUCTOR ALLOY

ORIGIN OF THE INVENTION

The invention was made in part by employees of the United States Government and may be manufactured and used by or for the Government of the United States of America for governmental purposes without the payment of any royalties thereon or therefor.

BACKGROUND OF THE INVENTION

1. Field of the Invention

This invention relates to semiconductive structures made from silicon germanium. More specifically, the invention is a lattice matched silicon germanium semiconductive alloy having at least one graded index silicon germanium layer deposited thereon.

2. Description of the Related Art

Silicon germanium (SiGe) is an important semiconductive alloy used in Field Effect Transistors (FETs), High Electron Mobility Transistors (HEMTs), Hetero Bi-polar Transistors (HBTs), Thermo-Electric (TE) devices, photovoltaic solar cells, and photon detectors. Typically, SiGe is grown on common silicon wafer substrates. However, the growth of thick (i.e., greater than tens of nanometers), high-quality (i.e., defect free) SiGe layers on a silicon substrate is difficult because SiGe has a larger lattice constant than silicon. This means that the SiGe layers close to the silicon substrate are strained while severe defects (e.g., threading dislocations, micro twins, cracks, delaminations, etc.) develop in the layers of SiGe that exceed the critical thickness of hundreds of nanometers because of the lattice mismatch. Thus, at best, only strained SiGe layers with very thin thicknesses (i.e., less than hundreds of nanometers) are utilized for high-quality electronic device fabrication.

Recently, methods for making thicker high-quality SiGe semiconductive alloys were disclosed in U.S. patent application Ser. No. 11/242,415, filed Sep. 27, 2005, the entire contents of which are hereby incorporated by reference. In this application, a lattice matched SiGe semiconductive alloy and method of fabricating same are provided. Briefly, the {0001} C-plane of a substrate of single crystalline $Al_2O_3$ (i.e., sapphire) is exposed and a {111} crystal plane of a cubic diamond structure SiGe is grown on the {0001} C-plane such that a <110> orientation of the cubic diamond structure SiGe is aligned with a <1,0,−1,0> orientation of the {0001} C-plane. A lattice match between the single crystalline $Al_2O_3$ and the cubic diamond structure SiGe is achieved by using a SiGe composition that is 0.7223 atomic percent silicon and 0.2777 atomic percent germanium. A strained layer can be grown on top of the lattice matched SiGe. The composition of the strained layer can be pure silicon, pure germanium, or a silicon germanium composition of the general form $Si_{1-Y}Ge_Y$ where Y is the atomic percent of germanium that satisfies the relationship 0.0<Y<1.0. However, the strained layer presents an abrupt transition on the lattice matched SiGe that causes (i) misfit dislocations, (ii) an electric potential barrier at the interface between the lattice matched SiGe and the strained layer, (iii) an abrupt change in refractive index, (iv) an abrupt bandgap change, (v) generation of interfacial mid-bandgap states, and (vi) abrupt strain build-up that tends to attract other atoms to thereby introduce impurities into the device.

SUMMARY OF THE INVENTION

Accordingly, it is an object of the present invention to provide a lattice matched silicon germanium (SiGe) semiconductive structure having improved performance when a strained layer is deposited thereon.

Other objects and advantages of the present invention will become more obvious hereinafter in the specification and drawings.

In accordance with the present invention, a silicon germanium (SiGe) semiconductive alloy and method of fabricating same are provided. A substrate of single crystalline $Al_2O_3$ having a {0001} C-plane is exposed. A {111} crystal plane of a cubic diamond structure SiGe is grown on the {0001} C-plane such that a <110> orientation of the cubic diamond structure SiGe is aligned with a <1,0,−1,0> orientation of the {0001} C-plane. A lattice match between the single crystalline $Al_2O_3$ and the cubic diamond structure SiGe is achieved by using a SiGe composition that is 0.7223 atomic percent silicon and 0.2777 atomic percent germanium. A layer of $Si_{1-X}Ge_X$ is formed on the cubic diamond structure SiGe so-grown on the {0001} C-plane. The value of X defines an atomic percent of germanium satisfying 0.2277<X<1.0. Further, the value of X is approximately 0.2777 where the layer of $Si_{1-X}Ge_X$ interfaces with the cubic diamond structure SiGe, and increases linearly with the thickness of the layer of $Si_{1-X}Ge_X$.

BRIEF DESCRIPTION OF THE DRAWINGS

FIG. 4B is a schematic view of another embodiment of the present invention in which two graded index layers are on top of a lattice matched SiGe alloy;

FIG. 4C is a schematic view of another embodiment of the present invention in which a strained layer is between two graded index SiGe layers; and FIG. 4D is a schematic view of another embodiment of the present invention in which a super lattice is formed by multiple repeats of a strained layer between graded index SiGe layers.

DETAILED DESCRIPTION OF THE INVENTION

The silicon germanium (SiGe)-based semiconductive structure of the present invention includes a high-quality (i.e., free of defects and dislocations) silicon germanium (SiGe) semiconductive alloy. The SiGe semiconductive alloy and the fabrication thereof are described in detail in the above-referenced patent application Ser. No. 11/242,415, filed Sep. 27, 2005, the entire contents of which are incorporated by reference and will be repeated herein below. The improved SiGe semiconductive alloy fabrication involves growing a cubic diamond structure SiGe on a trigonal crystal structure of single crystalline aluminum oxide ($Al_2O_3$) sapphire referred to hereinafter as "single crystalline $Al_2O_3$". The goal of zero defect/dislocations in this SiGe semiconductive alloy is achieved by arranging for a lattice match between the cubic diamond structure SiGe and the single crystalline $Al_2O_3$. In order to explain the lattice matching, reference will now be made to FIGS. 1A-1B and FIGS. 2A-2B. In the ensuing description, the well-known Miller indices notation of lattice planes will be used. That is, crystal planes are designated by numbers within "( )", groups of similar planes are designated by numbers within "{ }", direction or length is designated by numbers within "[ ]", and groups of similar directions are designated by numbers within "< >".

Figure 1A:
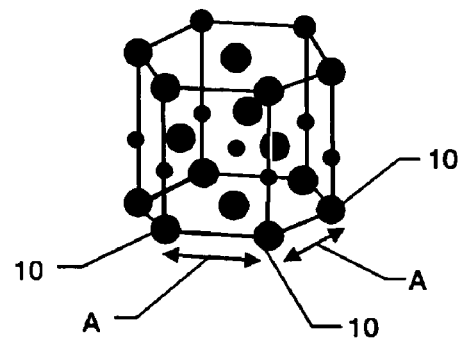
FIG. 1A depicts a simplified view of the atomic structure of single crystalline aluminum oxide ($Al_2O_3$) sapphire.
Figure 1B:
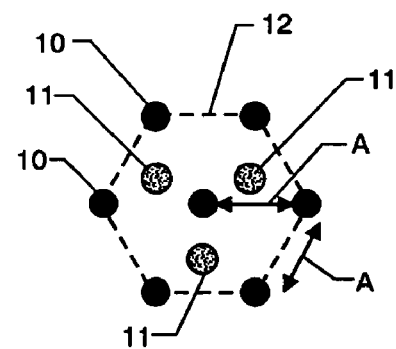
FIG. 1B depicts an atomic, planar view of the {0001} C-plane of single crystalline $Al_2O_3$.

In FIG. 1A, a simplified view of the atomic structure of single crystalline $Al_2O_3$ is illustrated with the basal plane's lattice constant (i.e., atomic distance) denoted by the letter "A". For single crystalline $Al_2O_3$, A is equal to 4.7580 angstroms. A hexagonal structure of the {0001} C-plane (i.e., one of the group of eight similar planes) of single crystalline $Al_2O_3$ is illustrated in FIG. 1B where the dark shaded circles 10 represent crystal lattice points in the {0001} C-plane and the light shaded circles 11 represent trigonal symmetry points on a layer of the structure beneath the {0001} C-plane. The hexagonal relationship with crystal lattice points 10 at the vertices thereof is referenced by numeral 12 and defines the <1,0,−1,0> orientation of the {0001} C-plane. The <1,0,−1,0> orientation refers to the group of six directions corresponding to the six similar planes defined by the {0001} C-plane. As is known in the art and for purposes of the present invention, the term "{0001} C-plane" refers to single crystalline $Al_2O_3$ that has been perfectly cut along the {0001} C-plane as well as slightly miscut single crystalline $Al_2O_3$ where "slightly miscut" refers to cut angles of ±10° or less. Methods of cutting single crystalline $Al_2O_3$ to expose the perfect or miscut {0001} C-plane thereof are well known in the art.

Figure 2A:
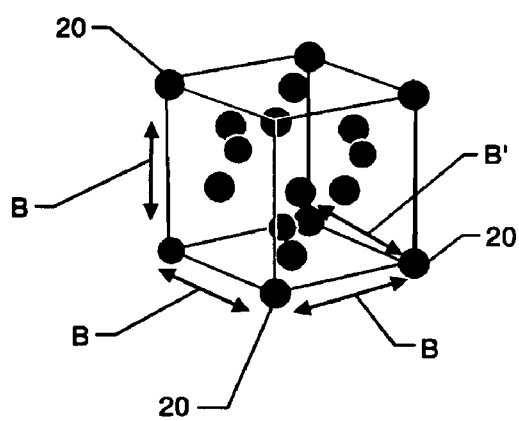
FIG. 2A depicts the cubic diamond atomic structure of silicon and germanium.
Figure 2B:
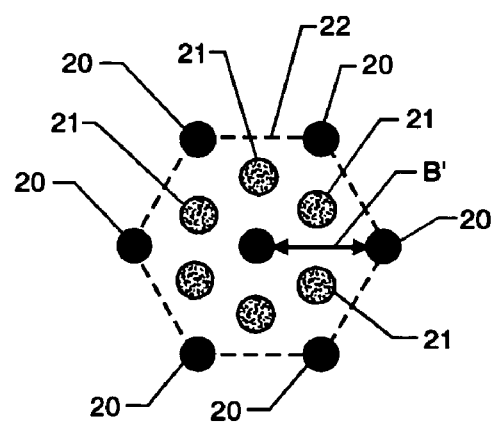
FIG. 2B depicts an atomic, planar view of the {111} crystal plane of the cubic diamond structure of FIG. 2A.

In FIG. 2A, the cubic diamond atomic structure of silicon and germanium is illustrated with a side dimension lattice constant (i.e., atomic distance between atoms 20) of "B" and the shortest atomic distance (between atoms) lattice constant being B' (i.e., the <220> distance) in the {111} crystal plane of the cubic diamond structure. FIG. 2B depicts a planar view of the {111} crystal plane of the cubic diamond structure where the dark shaded circles represent atoms 20 in the {111} crystal plane and the light shaded circles represent atoms 21 on a layer of the structure beneath the {111} crystal plane. The hexagonal relationship with atoms 20 at the vertices thereof is referenced by numeral 22 and defines the <110> orientation of the {111} crystal plane. The relationship between B and B' in the cubic diamond structure is B'=B(sqrt(3)/2). For a SiGe alloy having a cubic diamond structure, the value for B (and, therefore B') is dependent on the composition of the alloy. That is, for the general $Si_{1-Z}Ge_Z$ alloy with germanium composition Z in atomic percent, the lattice constant $B_{SiGe}$ is defined by $$ZB_{Ge}+(1-Z)B_{Si}$$

where $B_{Ge}$ is the side dimension lattice constant of germanium (i.e., 5.65791 angstroms), and $B_{Si}$ is the side dimension lattice constant of silicon (i.e., 5.43107 angstroms). Applying the above relationships, $B_{SiGe}$ is equal to approximately 5.49406 angstroms and the lattice constant $B'_{SiGe}$ in the {111} crystal plane of the cubic diamond structure SiGe is equal to approximately 4.5780 angstroms when Z=0.2777.

Thus, defect and dislocation-free SiGe growth is achieved by a lattice matching technique that defines the (i) plane and orientation relationships between cubic diamond SiGe and the $Al_2O_3$ substrate, and (ii) the composition of the cubic diamond SiGe. For lattice matched SiGe growth on single crystalline $Al_2O_3$, the {111} crystal plane of cubic diamond SiGe is grown on the {0001} C-plane of single crystalline $Al_2O_3$. Growth is controlled such that the <110> orientation of cubic diamond SiGe is aligned (i.e., parallel to) with the <1,0,−1,0> orientation of the {0001} C-plane.

The above described plane/orientation alignment achieves an exact lattice match when the cubic diamond SiGe, having a general composition defined by $Si_{1-Z}Ge_Z$, has a germanium composition of 0.2777 atomic percent and a silicon composition of 0.7223 atomic percent. At this composition, the lattice constant $B'_{SiGe}$ is given by $$sqrt(3)/2(ZB_{Ge}+(1-Z)B_{Si})$$

which equates to 4.7580 angstroms for Z=0.2777, thereby exactly matching the lattice constant A of single crystalline $Al_2O_3$. Therefore, by what amounts to a rhombohedral transformation of lattice parameters, lattice matching between cubic diamond SiGe and the single crystalline $Al_2O_3$ is achieved during the growth process thereby eliminating defects and dislocations caused by lattice mismatches. The lattice matching provided by the present invention will allow a thick, high-quality semiconductive SiGe alloy to be grown for use in a wide variety of electronic devices.

The above-described alloy fabrication can be achieved in a variety of ways. For example, the single crystalline $Al_2O_3$ can be obtained commercially or manufactured. The single crystalline $Al_2O_3$ substrate can be cleaned with degreasing and/or etching process before growth of the SiGe semiconductive alloy thereon. Lattice matched SiGe layer(s) can be grown with various standard growth methods, including but not limited to, Molecular Beam Epitaxy (MBE), Metal-Organic Chemical Vapor Deposition (MOCVD), Metal-Organic Chemical Vapor Phase Epitaxy (MOVPE), Hydride Vapor Phase Deposition (HVPE), Liquid Phase Epitaxy (LPE), Physical Vapor Deposition (PVD), Pulsed Laser Deposition (PLD), and sputtering methods. Germanium contents can be measured and calibrated with standard techniques, including but not limited to, Secondary Ion Mass Spectroscopy (SIMS), X-ray Diffraction (XRD), and ellipsometry.

To fabricate the final device structures, standard microfabrication technologies can be used, including but not limited to, lithography, etching, metallization, dopant diffusion/implantation and oxidation. The resulting cubic diamond SiGe on single crystalline $Al_2O_3$ can be used "as is" or can be removed from the substrate after growth to a desired thickness. Such methods of removal are well known in the art and could include laser cutting, hydrogen cracking, etc., the choice of which is not a limitation of the present invention.

Figure 3:
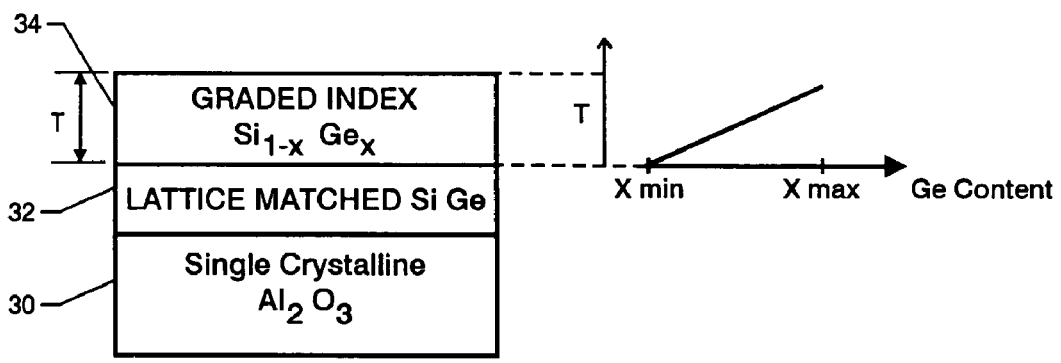
FIG. 3 is a schematic view of an embodiment of the present invention in which a graded index silicon germanium (SiGe) layer is on top of a lattice matched SiGe alloy.

In accordance with an embodiment of the present invention, the above-described SiGe semiconductive alloy serves as the base for a layer of graded index SiGe as will now be described with the aid of FIG. 3. In FIG. 3, the above-described single crystalline $Al_2O_3$ is referenced by numeral 30 and the above-described lattice matched SiGe is referenced by numeral 32. In general, a layer 34 of graded index SiGe is formed (e.g., grown) on the cubic diamond SiGe of the described SiGe semiconductive alloy where the composition of layer 34 is of the form $Si_{1-X}Ge_X$. The value of X defines the atomic percent of germanium in layer 34. More specifically, the value of X increases linearly with the thickness T of layer 34 as illustrated by the graph of germanium content adjacent layer 34 in FIG. 3. The minimum value of X or $X_{MIN}$ is at the interface of layers 32 and 34 while the maximum value of X or $X_{MAX}$ is at the full thickness T of layer 34. For the lattice matched SiGe layer 32, the minimum value $X_{MIN}$ should be approximately equal to 0.2777 or the germanium content of lattice matched layer 32. While the best results are achieved when $X_{MIN}$ equals the germanium content of 0.2777 of layer 32, the term "approximately" as used here is meant to define an acceptable range for $X_{MIN}$ satisfying $0.2277 \leq X_{MIN} \leq 0.3277$. The maximum value $X_{MAX}$ should satisfy the relationship $X_{MIN} < X_{MAX} < 1.0$.

The advantages of the above-described structure are numerous. The structure does not create abrupt strain build-up at the interface between layers 32 and 34. Therefore, the present invention provides a reduced number of misfit dislocations as the strain between the layers can be relaxed over a wide range of thicknesses of layer 34. Further, the structure does not present an abrupt potential barrier at the interface between layers 32 and 34. Therefore, the present invention can continuously change the conduction and valence bands to reduce carrier scattering. Still further, the structure slowly changes the bandgap energy so that a continuously varying quantum well can be constructed using the graded index SiGe layer. There is also no abrupt change in the index of refraction so the disclosed structure can reduce light scattering at the interface between layers 32 and 34. Thus, a very smooth waveguide could be constructed using the graded index SiGe layer. Finally, once the graded index SiGe layer is made on the lattice matched SiGe layer on sapphire, strain can be applied to the graded index SiGe layer in a compressive way with a greater germanium content or in a tensile way with a lesser germanium content. Therefore, the present invention provides a number of options in terms of designing the lattice strain factor.

Figure 4A:
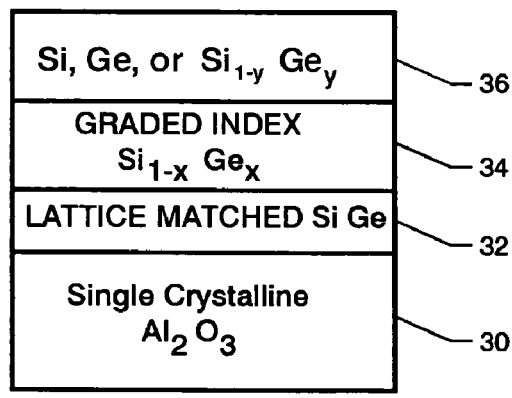
FIG. 4A is a schematic view of another embodiment of the present invention in which a strained layer is on top of the graded index SiGe layer.

The above-described embodiment of the present invention can be used as the basis for a number of other SiGe-based semiconductive structures. Several non-limiting examples of such semiconductive structures are illustrated in FIGS. 4A-4D. In FIG. 4A, a strained layer 36 is formed on top of graded index SiGe layer 34. The composition of layer 36 can be pure silicon, pure germanium, or a silicon germanium composition of the general form $Si_{1-Y}Ge_Y$ where Y is the atomic percent of germanium that satisfies the relationship $0.0 < Y < 1.0$. In FIG. 4B, another structure is illustrated where a reverse graded index SiGe layer 38 is formed on layer 34. The composition of layer 38 is of the general form $Si_{1-X'}Ge_{X'}$ where X' defines the atomic percent of germanium in layer 38. More specifically, the value of X' decreases linearly with the thickness T of layer 38 as illustrated by the graph of germanium content adjacent layer 38 in FIG. 4B. The maximum value of X' or $X'_{MAX}$ is at the interface of layers 34 and 38 while the minimum value of X' or $X'_{MIN}$ is at the full thickness T of layer 38. The maximum value $X'_{MAX}$ should be approximately equal to the maximum value $X_{MAX}$ of the germanium content of layer 34. In the present invention using lattice matched SiGe, the minimum value $X'_{MIN}$ should satisfy the relationship $0.2277 < X_{MIN} < X_{MAX}$. As would be understood by one of ordinary skill in the art, the structure of layers 34 and 38 can be repeated to form a super lattice.

In FIG. 4C, a single embedded strained layer 40 can be (i) grown between layers 34 and 38 by means of sequential epitaxial growth, or (ii) inserted after growth by means of ion implantation as would be well understood in the art. The composition of layer 40 can be pure silicon, pure germanium, or a silicon germanium composition of the general form $Si_{1-Y}Ge_Y$ where Y is the atomic percent of germanium that satisfies the relationship $0.0 < Y < 1.0$. In FIG. 4D, a super lattice structure is illustrated. In this example, the super lattice includes repeats of strained layer 40 interleaved with alternating ones of layers 34 and 38. The composition of each layer 40 can be pure silicon, pure germanium, or a silicon germanium composition of the general form $Si_{1-Y}Ge_Y$ where Y is the atomic percent of germanium that satisfies the relationship $0.0 < Y < 1.0$.

Although the invention has been described relative to specific embodiments thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

The invention claimed is:

1. A silicon germanium (SiGe)-based semiconductive structure adapted to be grown on a {0001} C-plane of single crystalline $Al_2O_3$, comprising:
   a cubic diamond structure SiGe having 0.7223 atomic percent silicon and 0.2777 atomic percent germanium, said cubic diamond structure SiGe having a {111} crystal plane adapted to be grown on the {0001} C-plane such that a <110> orientation of said cubic diamond structure SiGe is aligned with a <1,0,–1,0> orientation of the {0001} C-plane; and
   a layer of $Si_{1-X}Ge_X$ on said cubic diamond structure SiGe so-grown on the {0001} C-plane, wherein X
   (i) defines an atomic percent of germanium satisfying $0.2277 < X < 1.0$,
   (ii) is approximately 0.2777 where said layer of $Si_{1-X}Ge_X$ interfaces with said cubic diamond structure SiGe, and
   (iii) increases linearly with the thickness of said layer of $Si_{1-X}Ge_X$ to a maximum value $X_{MAX}$.

2. A SiGe-based semiconductive structure as in claim 1 further comprising pure silicon on said layer of $Si_{1-X}Ge_X$.

3. A SiGe-based semiconductive structure as in claim 1 further comprising pure germanium on said layer of $Si_{1-X}Ge_X$.

4. A SiGe-based semiconductive structure as in claim 1 further comprising $Si_{1-Y}Ge_Y$ on said layer of $Si_{1-X}Ge_X$ wherein Y defines an atomic percent of germanium satisfying $0.0 < Y < 1.0$.

5. A SiGe-based semiconductive structure as in claim 1 further comprising a layer of $Si_{1-X'}Ge_{X'}$ on said layer of $Si_{1-X}Ge_X$, wherein X'
   (i) defines an atomic percent of germanium satisfying $0.2277 < X' < 1.0$,
   (ii) is approximately $X_{MAX}$ where said layer of $Si_{1-X'}Ge_{X'}$ interfaces with said layer of $Si_{1-X}Ge_X$, and
   (iii) decreases linearly with the thickness of said layer of $Si_{1-X'}Ge_{X'}$.

6. A SiGe-based semiconductive structure as in claim 1 further comprising:
   pure silicon on said layer of $Si_{1-X}Ge_X$; and
   a layer of $Si_{1-X'}Ge_{X'}$ on said pure silicon, wherein X'
   (i) defines an atomic percent of germanium satisfying $0.2277 < X' < 1.0$,
   (ii) is approximately $X_{MAX}$ where said layer of $Si_{1-X'}Ge_{X'}$ interfaces with said pure silicon, and
   (iii) decreases linearly with the thickness of said layer of $Si_{1-X'}Ge_{X'}$.

7. A SiGe-based semiconductive structure as in claim 1 further comprising:
  pure germanium on said layer of $Si_{1-X}Ge_X$; and
  a layer of $Si_{1-X'}Ge_{X'}$ on said pure germanium, wherein X'
  (i) defines an atomic percent of germanium satisfying 0.2277<X'<1.0,
  (ii) is approximately $X_{MAX}$ where said layer of $Si_{1-X'}Ge_{X'}$ interfaces with said pure germanium, and
  (iii) decreases linearly with the thickness of said layer of $Si_{1-X'}Ge_{X'}$.

8. A SiGe-based semiconductive structure as in claim 1 further comprising:
  a layer of $Si_{1-Y}Ge_Y$ on said layer of $Si_{1-X}Ge_X$ wherein Y defines an atomic percent of germanium defined by 0.0<Y<1.0; and
  a layer of $Si_{1-X'}Ge_{X'}$ on said layer of $Si_{1-Y}Ge_Y$, wherein X'
  (i) defines an atomic percent of germanium satisfying 0.2277<X'<1.0,
  (ii) is approximately $X_{MAX}$ where said layer of $Si_{1-X'}Ge_{X'}$ interfaces with said layer of $Si_{1-Y}Ge_Y$, and
  (iii) decreases linearly with the thickness of said layer of $Si_{1-X'}Ge_{X'}$.

9. A silicon germanium (SiGe)-based semiconductive structure, comprising:
  single crystalline $Al_2O_3$ with a {0001} C-plane thereof being exposed;
  a cubic diamond structure SiGe having 0.7223 atomic percent silicon and 0.2777 atomic percent germanium, said cubic diamond structure SiGe having a {111} crystal plane grown on said {0001} C-plane such that a <110> orientation of said cubic diamond structure SiGe is aligned with a <1,0,-1,0> orientation of said {0001} C-plane; and
  a layer of $Si_{1-X}Ge_X$ on said cubic diamond structure SiGe so-grown on said {0001} C-plane, wherein X
  (i) defines an atomic percent of germanium satisfying 0.2277<X<1.0,
  (ii) is approximately 0.2777 where said layer of $Si_{1-X}Ge_X$ interfaces with said cubic diamond structure SiGe, and
  (iii) increases linearly with the thickness of said layer of $Si_{1-X}Ge_X$ to a maximum value $X_{MAX}$.

10. A SiGe-based semiconductive structure as in claim 9 further comprising pure silicon on said layer of $Si_{1-X}Ge_X$.

11. A SiGe-based semiconductive structure as in claim 9 further comprising pure germanium on said layer of $Si_{1-X}Ge_X$.

12. A SiGe-based semiconductive structure as in claim 9 further comprising $Si_{1-Y}Ge_Y$ on said layer of $Si_{1-X}Ge_X$ wherein Y defines an atomic percent of germanium satisfying 0.0<Y<1.0.

13. A SiGe-based semiconductive structure as in claim 9 further comprising a layer of $Si_{1-X'}Ge_{X'}$ on said layer of $Si_{1-X}Ge_X$, wherein X'
  (i) defines an atomic percent of germanium satisfying 0.2277<X'<1.0,
  (ii) is approximately $X_{MAX}$ where said layer of $Si_{1-X'}Ge_{X'}$ interfaces with said layer of $Si_{1-X}Ge_X$, and
  (iii) decreases linearly with the thickness of said layer of $Si_{1-X'}Ge_{X'}$.

14. A SiGe-based semiconductive structure as in claim 9 further comprising:
  pure silicon on said layer of $Si_{1-X}Ge_X$; and
  a layer of $Si_{1-X'}Ge_{X'}$ on said pure silicon, wherein X'
  (i) defines an atomic percent of germanium satisfying 0.2277<X'<1.0,
  (ii) is approximately $X_{MAX}$ where said layer of $Si_{1-X'}Ge_{X'}$ interfaces with said pure silicon, and
  (iii) decreases linearly with the thickness of said layer of $Si_{1-X'}Ge_{X'}$.

15. A SiGe-based semiconductive structure as in claim 9 further comprising:
  pure germanium on said layer of $Si_{1-X}Ge_X$; and
  a layer of $Si_{1-X'}Ge_{X'}$ on said pure germanium, wherein X'
  (i) defines an atomic percent of germanium satisfying 0.2277<X'<1.0,
  (ii) is approximately $X_{MAX}$ where said layer of $Si_{1-X'}Ge_{X'}$ interfaces with said pure germanium, and
  (iii) decreases linearly with the thickness of said layer of $Si_{1-X'}Ge_{X'}$.

16. A SiGe-based semiconductive structure as in claim 9 further comprising:
  a layer of $Si_{1-Y}Ge_Y$ on said layer of $Si_{1-X}Ge_X$ wherein Y defines an atomic percent of germanium defined by 0.0<Y<1.0; and
  a layer of $Si_{1-X'}Ge_{X'}$ on said layer of $Si_{1-Y}Ge_Y$, wherein X'
  (i) defines an atomic percent of germanium satisfying 0.2277<X'<1.0,
  (ii) is approximately $X_{MAX}$ where said layer of $Si_{1-X'}Ge_{X'}$ interfaces with said layer of $Si_{1-Y}Ge_Y$, and
  (iii) decreases linearly with the thickness of said layer of $Si_{1-X'}Ge_{X'}$.

17. A silicon germanium (SiGe)-based semiconductive structure adapted to be grown on a {0001} C-plane of single crystalline $Al_2O_3$, comprising:
  a cubic diamond structure defined by a general form $Si_{1-Z}Ge_Z$ and having a {111} crystal plane grown on the {0001} C-plane such that a <110> orientation of said cubic diamond structure is aligned with a <1,0,-1,0> orientation of the {0001} C-plane, wherein Z defines an atomic percent of germanium of approximately 0.2777;
  a layer of $Si_{1-X}Ge_X$ grown on said cubic diamond structure so-grown on the {0001} C-plane, wherein X
  (i) defines an atomic percent of germanium satisfying 0.2277<X<1.0,
  (ii) is in the range of 0.2277 to 0.3277 where said layer of $Si_{1-X}Ge_X$ interfaces with said cubic diamond structure, and
  (iii) increases linearly with the thickness of said layer of $Si_{1-X}Ge_X$ to a maximum value $X_{MAX}$.

18. A SiGe-based semiconductive structure as in claim 17 further comprising pure silicon on said layer of $Si_{1-X}Ge_X$.

19. A SiGe-based semiconductive structure as in claim 17 further comprising pure germanium on said layer of $Si_{1-X}Ge_X$.

20. A SiGe-based semiconductive structure as in claim 17 further comprising $Si_{1-Y}Ge_Y$ on said layer of $Si_{1-X}Ge_X$ wherein Y defines an atomic percent of germanium satisfying 0.0<Y<1.0.

21. A SiGe-based semiconductive structure as in claim 17 further comprising a layer of $Si_{1-X'}Ge_{X'}$ on said layer of $Si_{1-X}Ge_X$, wherein X'
  (i) defines an atomic percent of germanium satisfying 0.2277<X'<1.0,
  (ii) is approximately $X_{MAX}$ where said layer of $Si_{1-X'}Ge_{X'}$ interfaces with said layer of $Si_{1-X}Ge_X$, and
  (iii) decreases linearly with the thickness of said layer of $Si_{1-X'}Ge_{X'}$.

22. A SiGe-based semiconductive structure as in claim 17 further comprising:
  pure silicon on said layer of $Si_{1-X}Ge_X$; and
  a layer of $Si_{1-X'}Ge_{X'}$ on said pure silicon, wherein X'
  (i) defines an atomic percent of germanium satisfying 0.2277<X'<1.0, (ii) is approximately $X_{MAX}$ where said layer of $Si_{1-X'}Ge_{X'}$ interfaces with said pure silicon, and
(iii) decreases linearly with the thickness of said layer of $Si_{1-X'}Ge_{X''}$.

23. A SiGe-based semiconductive structure as in claim 17 further comprising:
pure germanium on said layer of $Si_{1-X}Ge_X$; and
a layer of $Si_{1-X'}Ge_{X'}$ on said pure germanium, wherein X'
(i) defines an atomic percent of germanium satisfying 0.2277<X'<1.0,
(ii) is approximately $X_{MAX}$ where said layer of $Si_{1-X'}Ge_{X'}$ interfaces with said pure germanium, and
(iii) decreases linearly with the thickness of said layer of $Si_{1-X'}Ge_{X''}$.

24. A SiGe-based semiconductive structure as in claim 17 further comprising:
a layer of $Si_{1-Y}Ge_Y$ on said layer of $Si_{1-X}Ge_X$ wherein Y defines an atomic percent of germanium defined by 0.0<Y<1.0; and
a layer of $Si_{1-X'}Ge_{X'}$ on said layer of $Si_{1-Y}Ge_Y$, wherein X'
(i) defines an atomic percent of germanium satisfying 0.2277<X'<1.0,
(ii) is approximately $X_{MAX}$ where said layer of $Si_{1-X'}Ge_{X'}$ interfaces with said layer of $Si_{1-Y}Ge_Y$, and
(iii) decreases linearly with the thickness of said layer of $Si_{1-X'}Ge_{X''}$.

* * * * *

UNITED STATES PATENT AND TRADEMARK OFFICE
CERTIFICATE OF CORRECTION

PATENT NO.        : 7,514,726 B2  Page 1 of 1
APPLICATION NO.   : 11/387086
DATED             : March 21, 2006
INVENTOR(S)       : Yeonjoon Park et al.

It is certified that error appears in the above-identified patent and that said Letters Patent is hereby corrected as shown below:

On title page, item 54 and Col. 1, Line 2,
replace "Geranium"
with "Germanium."

Signed and Sealed this

Sixteenth Day of June, 2009

JOHN DOLL
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 7,514,726 B2 | Page 1 of 1 |
| APPLICATION NO. | : 11/387086 | |
| DATED | : April 7, 2009 | |
| INVENTOR(S) | : Yeonjoon Park et al. | |

It is certified that error appears in the above-identified patent and that said Letters Patent is hereby corrected as shown below:

On title page, item 54 and Col. 1, Line 2,
replace "Geranium"
with "Germanium."

This certificate supersedes the Certificate of Correction issued June 16, 2009.

Signed and Sealed this

Fourteenth Day of July, 2009

JOHN DOLL
*Acting Director of the United States Patent and Trademark Office*